(12) United States Patent
Begley et al.

(10) Patent No.: US 6,551,897 B2
(45) Date of Patent: Apr. 22, 2003

(54) WAFER TRENCH ARTICLE AND PROCESS

(75) Inventors: Patrick Anthony Begley, West Melbourne, FL (US); Donald Frank Hemmenway, Melbourne, FL (US); George Bajor, Melbourne, FL (US); Anthony Lee Rivoli, Palm Bay, FL (US); Jeanne Marie McNamara, Palm Bay, FL (US); Michael Sean Carmody, Palm Bay, FL (US); Dustin Alexander Woodbury, Indian Harbour Beach, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/993,968

(22) Filed: Nov. 16, 2001

(65) Prior Publication Data

US 2002/0076915 A1 Jun. 20, 2002

Related U.S. Application Data

(62) Division of application No. 09/283,530, filed on Apr. 1, 1999, now Pat. No. 6,365,953, which is a division of application No. 08/637,937, filed on Apr. 23, 1996, now Pat. No. 5,933,746.

(51) Int. Cl.$^7$ .......................................... H01L 21/762
(52) U.S. Cl. ................... 438/404; 438/406; 438/437
(58) Field of Search ................... 438/404, 406, 438/437, FOR 222, 759, 763

(56) References Cited

U.S. PATENT DOCUMENTS

| | | | |
|---|---|---|---|
| 4,532,701 A | 8/1985 | Kameyama et al. | |
| 4,900,692 A | * 2/1990 | Robinson | 438/421 |
| 4,984,039 A | * 1/1991 | Douglas | 257/301 |
| 5,084,408 A | 1/1992 | Baba et al. | |
| 5,116,779 A | 5/1992 | Guchi | |
| 5,182,221 A | * 1/1993 | Sato | 438/424 |
| 5,217,919 A | 6/1993 | Gaul et al. | |
| 5,448,102 A | 9/1995 | Gaul et al. | |
| 5,581,110 A | * 12/1996 | Razouk et al. | 257/513 |
| 5,700,712 A | * 12/1997 | Schwalke | 438/430 |
| 5,712,205 A | 1/1998 | Park et al. | |
| 5,719,085 A | * 2/1998 | Moon et al. | 438/424 |
| 5,721,448 A | 2/1998 | Hauf et al. | |
| 5,872,058 A | * 2/1999 | Van Cleemput et al. | 438/692 |
| 5,895,255 A | 4/1999 | Tsuchiaki | |
| 6,030,881 A | * 2/2000 | Papasouliotis et al. | 438/424 |

FOREIGN PATENT DOCUMENTS

| | | | |
|---|---|---|---|
| JP | 6-196653 | 7/1994 | |
| JP | 2000306992 A | * 11/2000 | H01L/21/76 |

* cited by examiner

Primary Examiner—George Fourson
(74) Attorney, Agent, or Firm—Fogg and Associates, LLC; Scott U. Lundberg

(57) ABSTRACT

A bonded wafer 100 has a device substrate 16 with isolation trenches 30 defining device regions 18. Oxide dogbone structures are removed before filling trenches 30. Voids 36 in the trenches are spaced from the top of the trenches. The trenches are covered with an oxide layer 30 and filled with polysilicon 34. A LOCOS mask structure comprising a layer of CVD pad oxide and silicon nitride 50 cover the trenches and the adjacent device substrate regions.

7 Claims, 6 Drawing Sheets

WAFER TRENCH ARTICLE AND PROCESS

CROSS-REFERENCE TO RELATED APPLICATIONS

This application is a divisional application of U.S. patent application Ser. No. 09/283,530, filed Apr. 1, 1999, now U.S. Pat. No. 6,365,953, which is a divisional of U.S. patent application Ser. No. 08/637,937, filed Apr. 23, 1996, issued U.S. Pat. No. 5,933,746.

BACKGROUND

This invention relates generally to semiconductor wafer processing and, in particular, to processes that form trenches in wafers while reducing device stress and defects.

Isolation trenches are common features in integrated circuits. Trenches surround devices and isolate one device from another. Bonded wafers, especially bonded wafers made in accordance with U.S. Pat. No. 5,387,555 assigned to the same assignee as this invention, provide a bond oxide layer between a device substrate and a handle substrate. Trenches extend from the surface of the device substrate down to the bond oxide. The trench side walls and floors are then covered with one or more insulating materials. The trenches are filled with a conformal material, typically polysilicon. However, excess insulating material accumulates at the top corners of the trenches and interferes with the filling process. As a result, trenches have voids that extend to the tops of the trenches.

It is common to oxidize exposed surfaces of the device substrate or exposed surfaces of a polysilicon layer in order to convert the device silicon or the polysilicon into silicon dioxide and thereby form a region of isolating material. During a thermal oxidation process, each atom of silicon is joined by two atoms of oxygen. The corner regions at the top of a trench lined with thermal oxide come under stress. Those corner regions increase in volume and the increased volume creates stress in adjacent device area. The stress can result in device defects.

Accordingly, there is an unmet need for an improved process that provides isolation trenches in an integrated circuit without generating stress and device defects. In particular, there is an unmet need for an improved process that reduces device stress and device defects.

SUMMARY

The invention includes a new integrated circuit and a new method of manufacturing the integrated circuit. The integrated circuit has two or more device regions in a device substrate of semiconductor material, typically monocrystalline silicon. The device substrate may be either a single wafer of silicon or the device substrate of a bonded wafer. A bonded wafer may include a handle substrate of suitable material, also typically silicon. The handle substrate is bonded to the device substrate using an oxide bonding process that provides an oxide bonding layer of silicon dioxide on the bottom of the device substrate. The device substrate is separated into device regions by isolation trenches. Each isolation trench has a floor and sidewalls spaced from each other. The trench sidewalls extend into the device substrate. The sidewalls in a bonded wafer extend to the bonding oxide layer.

The isolation trenches are formed by masking the device substrate and removing device silicon from unmasked regions to form trenches. Each trench has a floor and sidewalls spaced from each other. A nominally conformal layer of insulating material, typically silicon dioxide, is formed on the sidewalls and the floor. The insulating material tends to increase in thickness at the upper corner openings of the trench to produce dogbone structure. The dogbone structures are removed by a plasma anisotropic etch. A semiconductor material (polysilicon) is deposited on the device substrate to fill the trenches. With the dogbone structure removed, any voids that form in the filling material are small and are spaced from the top of the trench. The filling material is planarized to the surface of the device substrate. Then the device substrate is covered with a pad oxide layer and a silicon nitride layer. The pad oxide layer may be deposited or thermally grown. The oxide and silicon nitride layers are selectively removed from regions between trenches and remain over the trenches during further thermal oxidations. The oxide and silicon nitride layers prevent the growth of thermal oxides in the trench filling voids and at the tops of the trenches adjacent to the sidewalls. After thermal oxidations are substantially completed (e.g. no further oxidations greater than 500 Å) the nitride mask over the trenches may be removed.

DESCRIPTION OF THE DRAWINGS

FIGS. 1A–5A show sequential steps in a prior art trench process;

FIGS. 1B–5B show a corresponding series or sequential steps in the inventive trench process.

DETAILED DESCRIPTION

Figure 1A:
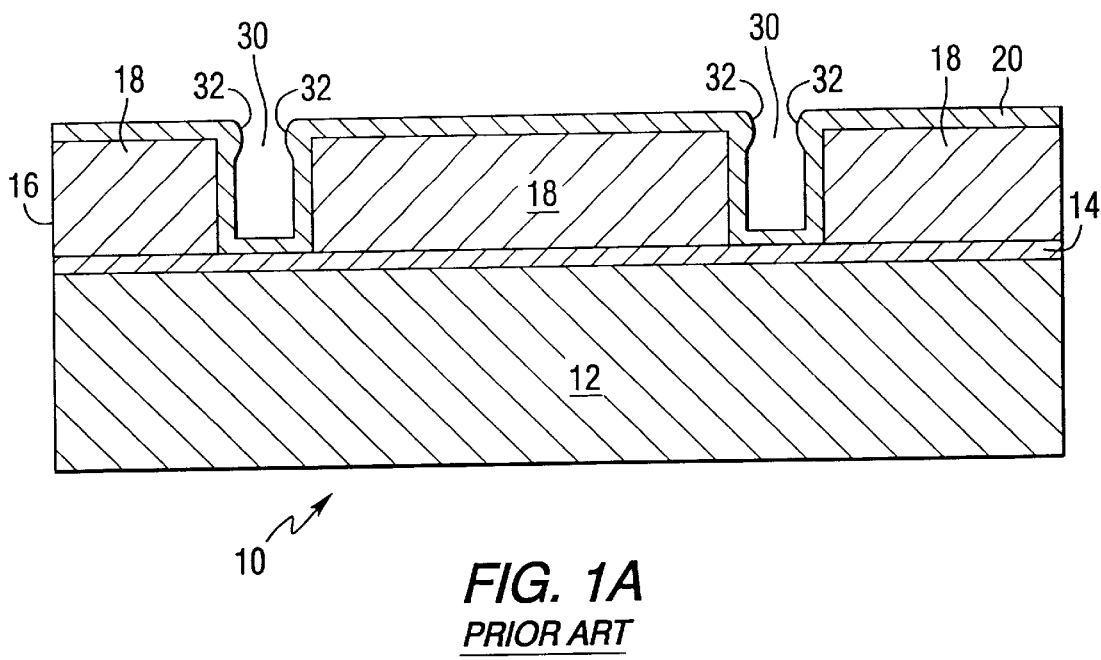

One problem of prior art trench processes is the formation of dogbone structures at trench openings. With reference to FIG. 1A, there is generally shown a bonded wafer substrate 10 comprising a handle substrate 12 that is oxide bonded to a device substrate 16 by oxide bonding layer 14. The device wafer 16 is suitably masked and etched in order to form trenches 30 and device regions 18. A deposited oxide process covers the exposed surfaces of the device substrate, including the side walls and the floors of the trenches 30, to create oxide layer 20. The deposition process also creates dogbone structures 32 at the upper corner openings of the trenches 30. The dogbone structures 32 are regions of increased oxide thickness that extend toward the opening of the trench 30. The dogbone structures 32 reduce the trench openings. The reduced openings make it difficult to deposit a conformal layer of trench fill material in the trenches. As a result, trenches with dogbone structures often have voids that extend to the tops of the trenches.

Figure 1B:
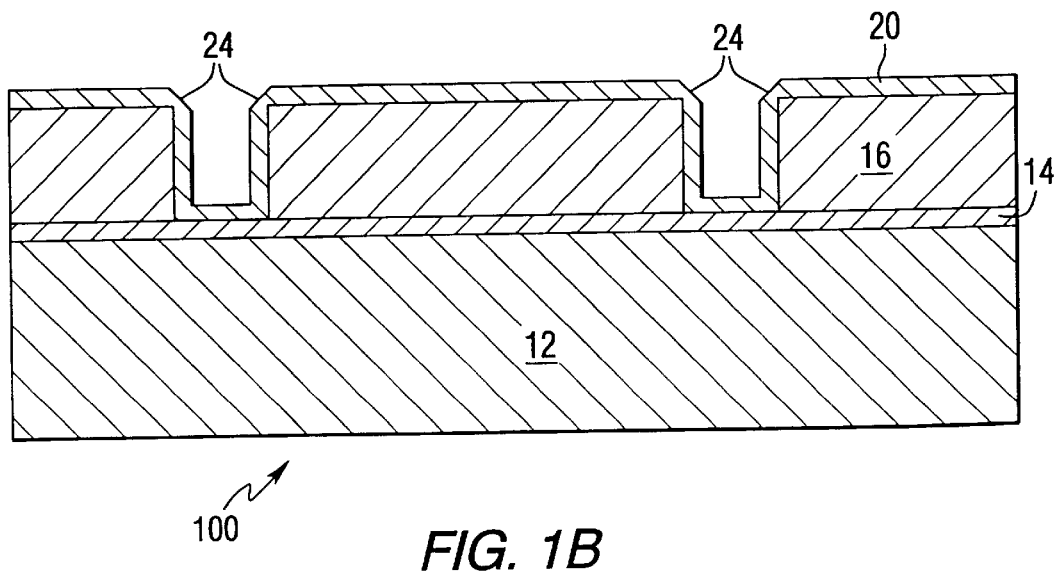

The invention solves the dogbone problem by removing the dogbone structures prior to filling the trenches. In FIG. 1B, the dogbone structures 32 on bonded wafer substrate 100 are removed by anisotropically etching the oxide layer 20. The anisotropic etch is typically a plasma assisted etch which is designed to remove oxide material at the maximum sputtering angle of around 45° to the surface of the wafer. In order to remove the dogbone structures 32, the bonded wafer substrate 100 is subjected to the anisotropic etch for approximately seven minutes. A typical etching apparatus is a AME8110 machine made by Applied Materials. The etching process creates facets on the upper corners. The facets 24 slope away from the openings and thus widen the openings.

Figure 2A:
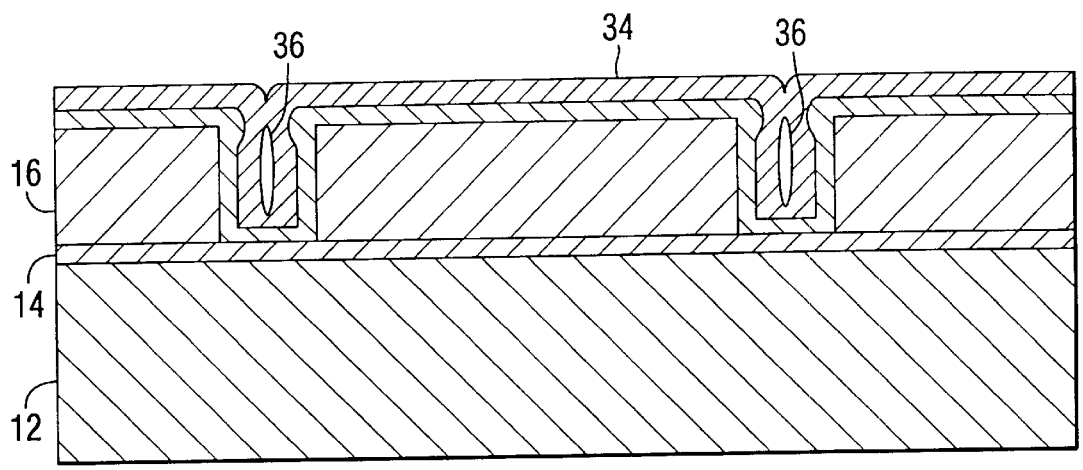

FIG. 2A illustrates another typical problem of prior art bonded wafer trench processes. A conformal layer of polysilicon 34 is deposited by chemical vapor deposition over the device substrate 16 in order to fill the trenches 30. However, the conformal layer of polysilicon layer 34 does not completely fill the trenches 30. Instead, voids 36 are left in the trenches. The voids are due, in part, to the presence of the dogbone structures 32 and the trench shape that reduce the trench openings. FIG. 2A shows trenches with sidewalls perpendicular to the trench floor. However, the trench walls may taper toward or away from each other. The voids can exist in thermal oxide passivated trenches, deposited oxide passivated trenches or combination thermal and deposited oxide passivated trenches. The void may extend laterally along all or substantially all the length of the trench. So, the void is a near-continuous, subsurface channel in the trench. Vertical portions of voids 36 often extend to the tops of the trenches where they oxidize later in the process. As a result, the silicon adjacent the vertical portions and the subsurface lateral portions is oxidized.

Figure 2B:
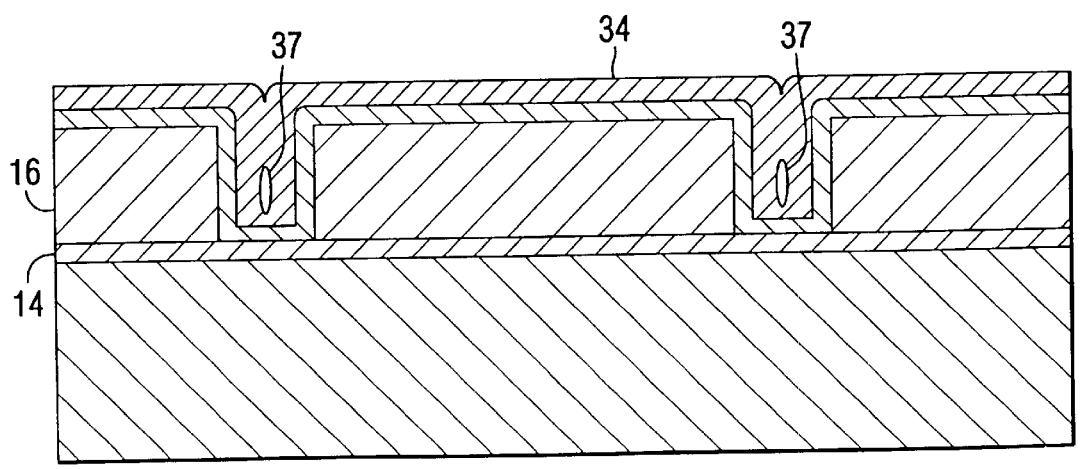

Turning to FIG. 2B of the invention, there is shown how the faceting of the trench openings removes the dogbone 32 and improves the trench profile to enhance the filling of the trenches 30. So, without interfering dogbone structures and having a more tapered trench opening, the polysilicon 34 more fully fills the trenches 30. Although voids 37 may still be present in the trenches 30, the voids are smaller and are spaced from the tops of the trenches.

Figure 3A:
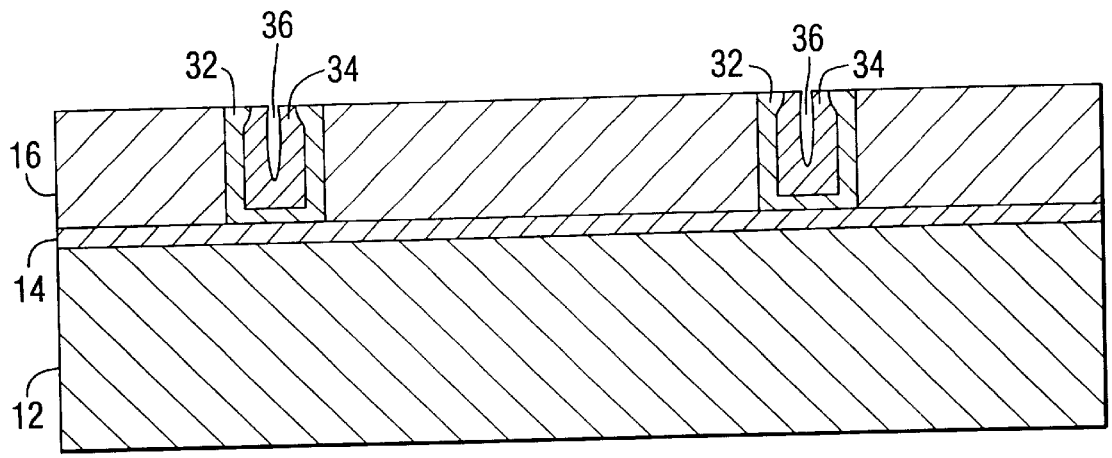
Figure 3B:
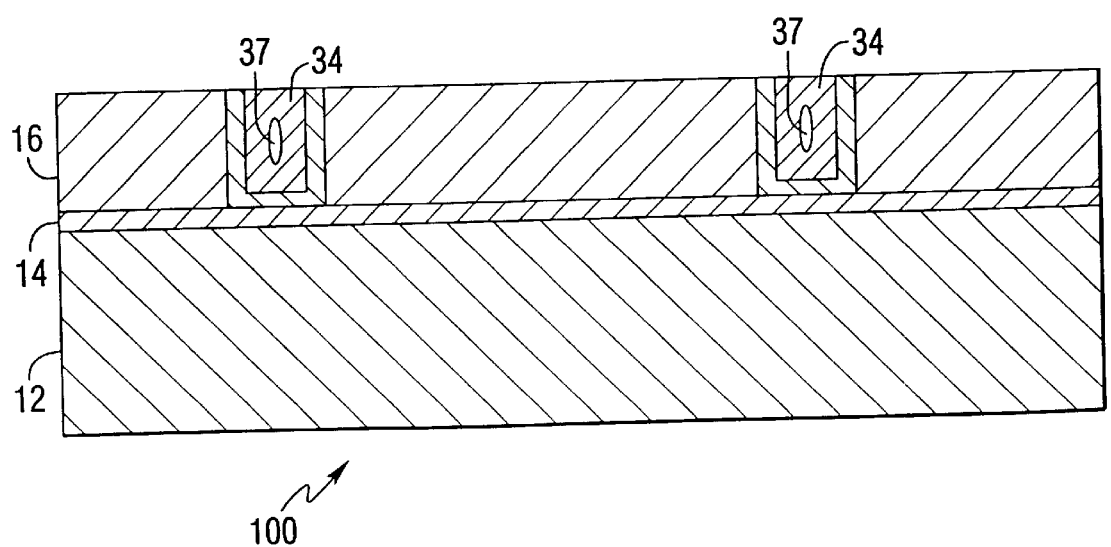
Figure 4A:
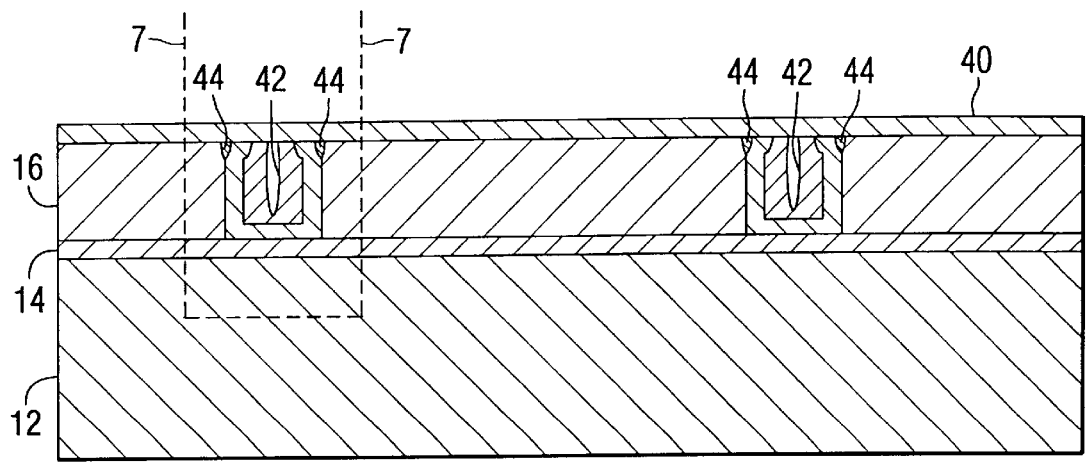
Figure 7:
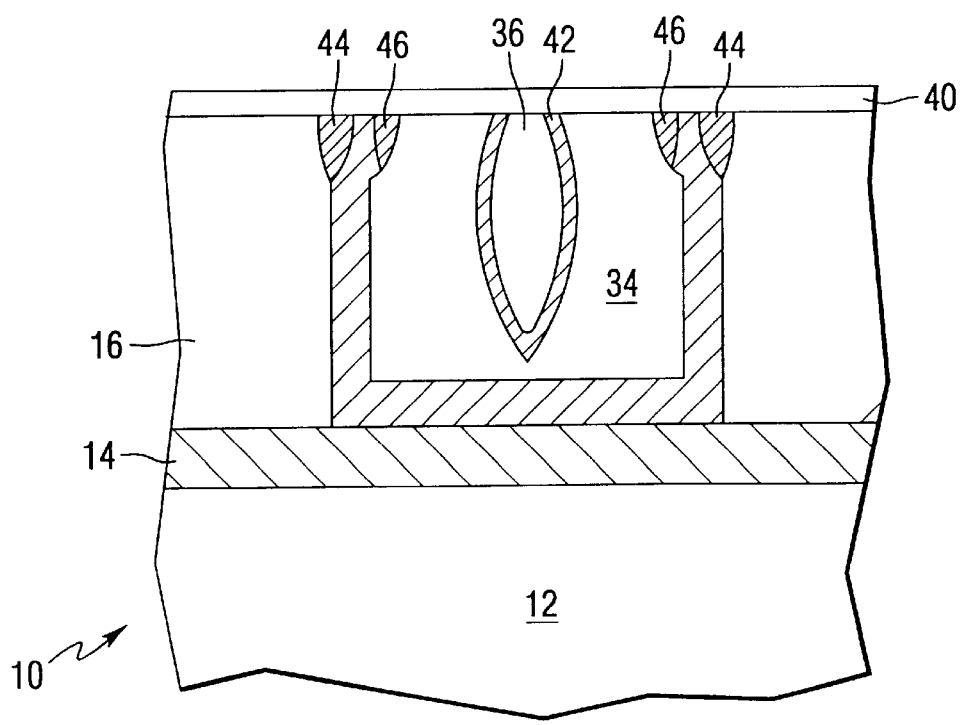
FIG. 7 is an enlarged, partial view of the structure shown inside dashed line 7–7' of FIG. 4A.

The prior art process planarizes the surface of the device wafer 16 in order to remove excess polysilicon 34. As shown in FIG. 3A, after the polysilicon layer 34 is planarized the voids 36 are open at the surface of the device wafer 16. The comers of the trenches may become sources of increased stress and defects. As shown in FIGS. 4A and 7, a typical step following planarization is growth of a pad oxide 40 on the device substrate 16. The pad oxide is grown by thermal oxidation of the silicon in device substrate 16 and the polysilicon 34 in the trenches 30. As expected, the surface of the voids and the comers of the trenches are similarly oxidized. The growth of oxides 44 and 46 in corner regions near the dogbones 33 and oxide 42 on the polysilicon 34 in void regions 36 increase stress and tends to induce defects in device regions 18 of device substrate 16.

The thermal pad oxide layer 40 may be the first step in a local oxidation of silicon (LOCOS) process such as described in U.S. Pat. No. 5,217,919, the entire disclosure of which is herein incorporated by reference. In a typical LOCOS process, isolation regions are created in the surface of the device islands 18. A nitride layer is deposited over the surface of the device island in regions where isolation is not required. The nitride layer seals the underlying silicon from the subsequent thermal oxidation. The nitride layer is typically deposited upon a relatively thin pad oxide layer. A thin pad oxide layer is used to reduce nitride stress effects in the silicon and because it is very difficult to selectively remove nitride with respect to silicon. However, there are many known etching materials that can selectively remove nitride with respect to silicon dioxide. A typical etchant is hot phosphoric acid (wet etch) or $SF_6$ (reactive ion etch). So, in a typical device island, the device area is masked with a nitride layer and the surrounding exposed silicon is thermally oxidized to create a relatively thick LOCOS layer. The nitride layer is stripped and the device is formed within the boundaries of the LOCOS layer.

Figure 4B:
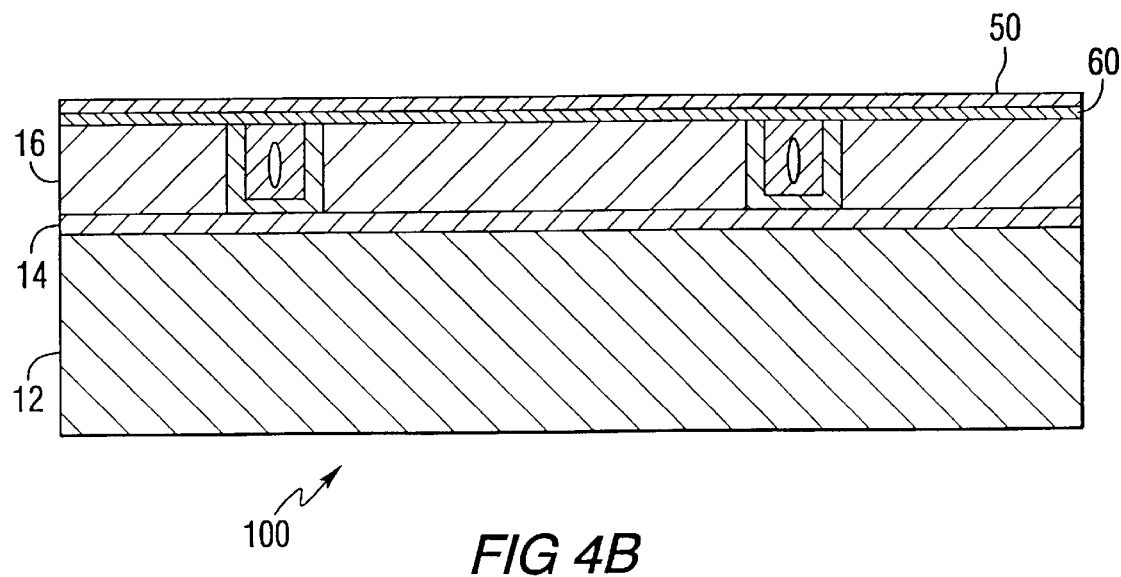

Turning to FIG. 4B, the problem of prior art thermal oxide stress in the isolation trenches is solved by using a chemical vapor deposition process in order to form a deposited pad oxide layer 60. The deposited pad oxide layer 60 does not consume any of the silicon in the device substrate 16 or any of the polysilicon in the trenches 30. Since the deposited pad oxide layer 60 does not consume any silicon, the process shown in FIG. 4B does not oxidized the comers 44 at the top side walls of the trenches 30 as shown in FIG. 4A. A layer of silicon nitride 50 is deposited over the CVD pad oxide layer 40.

Figure 5A:
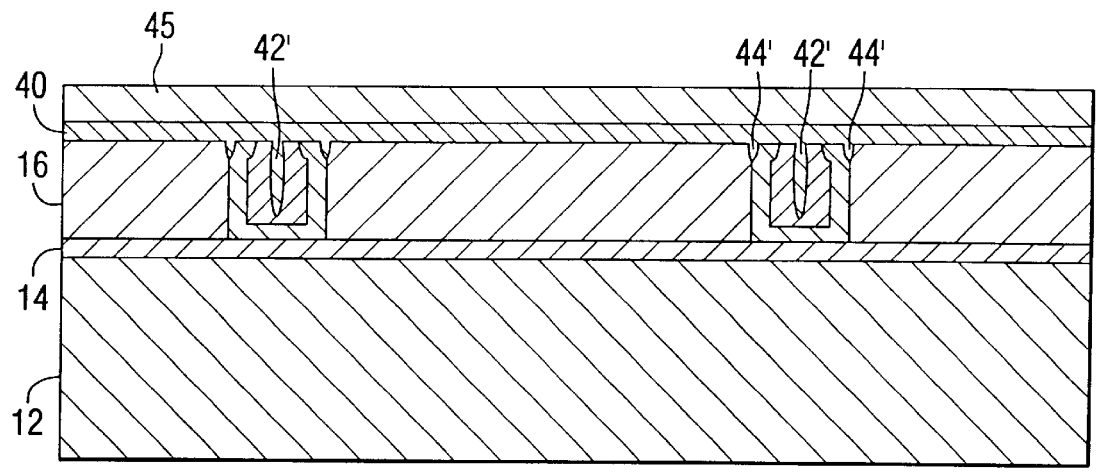

Turning to FIG. 5A, there is shown the prior art structure 10 during a further step where a subsequent oxide layer 45 is grown over the device substrate 16. The growth of the thermal oxide layer 45 further oxidizes the silicon and expands the corner oxide regions 44' at the top of the trenches and also expands regions 42' on the surface of voids 36.

Figure 5B:
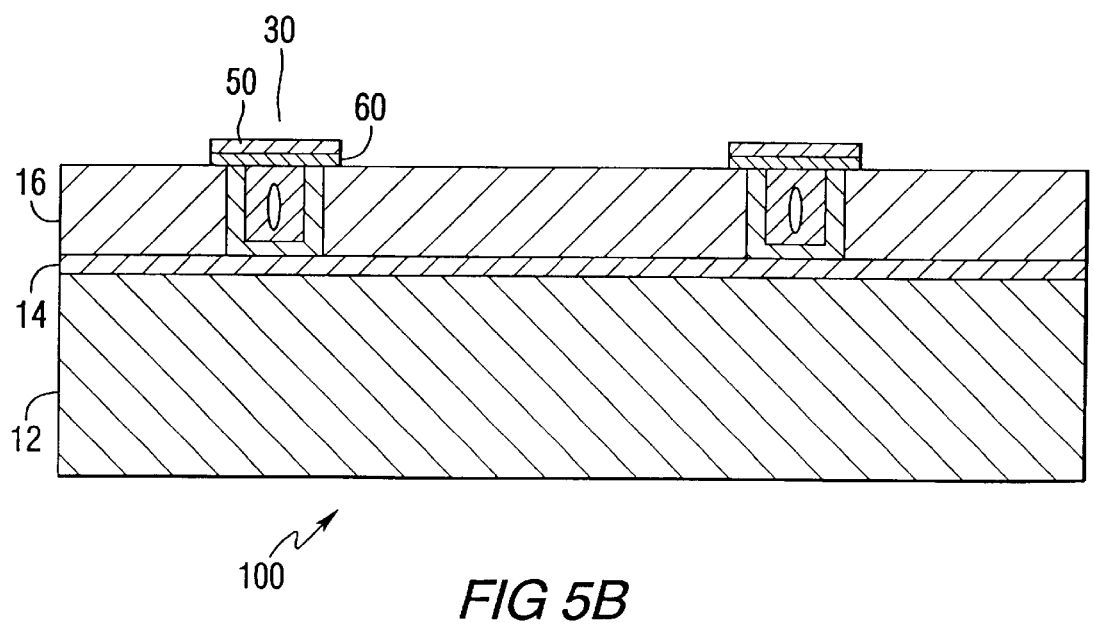

As shown in FIG. 5B, the nitride layer is removed except over the trenches 30. The silicon nitride cap 50 will prevent thermal oxidation of the silicon beneath the silicon nitride layer. Accordingly, thermal oxidations subsequent to definition of the silicon nitride cap 50 may be carried out over the rest of the device substrate or over selected portions of device substrate. In either case no oxidation occurs in the trench regions capped by the nitride layer 50. Semiconductor devices, including mos, jfet, and bipolar devices, are then formed in device substrate 16 to create integrated circuits in a manner well known to one skilled in the art. After all thermal oxidations are completed, the nitride cap structure 50 may be removed from over the trenches or it may be left in place depending on the constraints of the process. The nitride cap 50 may be removed earlier in the process and still be effective so long as subsequent thermal oxidations are relatively small in thickness, i.e., less than about 500 Angstroms.

Figure 6:
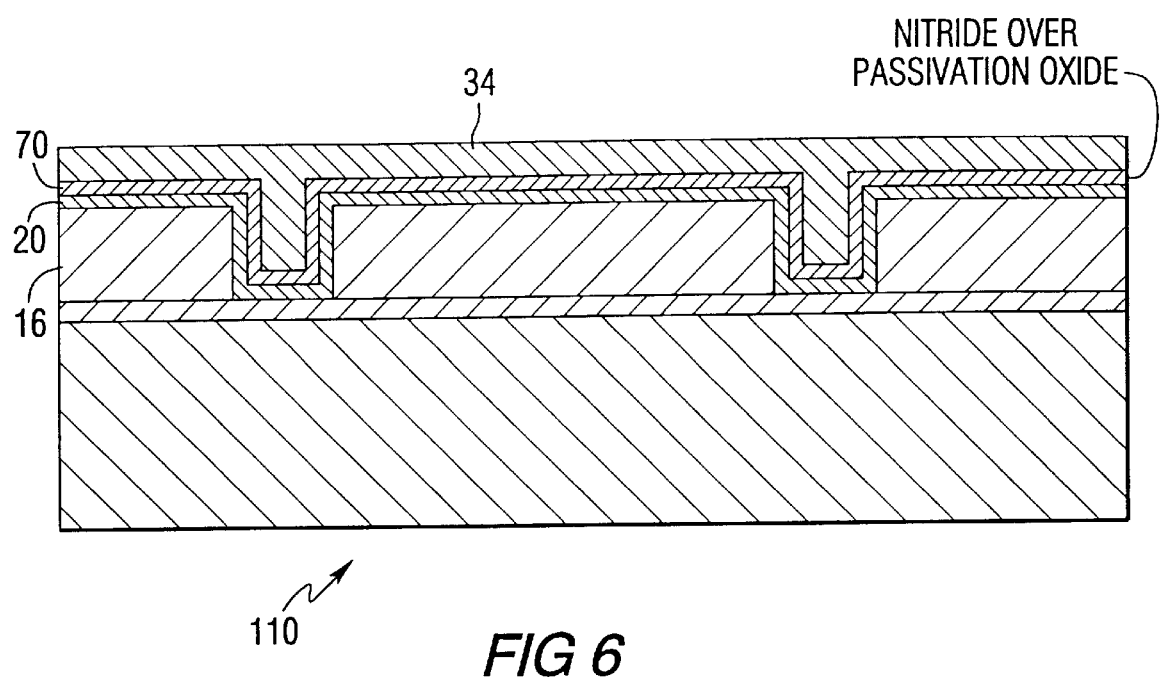
FIG. 6 shows an alternate embodiment of the invention where the protective nitride is deposited over the passivation oxide.

With reference to FIG. 6, there is shown a further embodiment of the invention. There, a bond wafer substrate 110 has a nitride layer 70 deposited over the passivation oxide layer 20 that covers the device substrate 16 and the side walls and the floors of the trenches 30. The step of depositing nitride layer 70 is performed subsequent to the step shown in FIG. 1B, i.e. after the passivation oxide 20 is conformally deposited. The nitride layer 70 thus seals the passivation oxide 20. A conformal layer of polysilicon 34 is then deposited to fill the trenches and subsequently planarized as shown in the above steps of FIGS. 1B–5B. Although the embodiment shown in FIG. 6 may create voids in the center of the polysilicon in the trenches, nevertheless it will prevent undesirable thermal oxide corners 44.

Having thus described embodiments of the invention, those skilled in the art will appreciate that further changes, additions, and modifications may be made to the disclosed embodiments without departing from the spirit and the scope of the claims. In particular, those skilled in the art will appreciate that, while the preferred embodiment of the invention is described in connection with a bonded wafer structure, the invention may also be practiced in single substrate wafers. Also, while the process is described in connection with an isolation trench, it may be applied to any trench structure including but not limited to capacitor trenches for dynamic random access memories and trench gate structures in dmos, qvdmos, mct and igbt devices.

What is claimed is:

1. A method for fabricating trenches for integrated circuits formed on a semiconductor device substrate comprising the steps of:

opening trenches defined by opposite sidewalls and a floor in the semiconductor device substrate to form one or more device islands between trenches;

forming a layer of insulating material over the device substrate and over the sidewalls and the floors of the trenches and forming regions of relatively thick insulating material on the trench sidewalls near tops of the trenches;

faceting portions of said regions of relatively thick insulating material near the tops of the trenches; and depositing fill material in the trenches.

2. The method of claim 1 wherein the semiconductor device substrate comprises monocrystalline silicon and the fill material comprises polysilicon.

3. The method of claim 1 wherein the insulating material comprises silicon dioxide.

4. The method of claim 1 further comprising the step of depositing a pad layer of insulating material over the device substrate, depositing LOCOS masking layer of a second insulating material over the first insulating material, and selectively removing the first and second insulating materials from regions between the trenches to leave a LOCOS mask over the trenches.

5. The method of claim 1 further comprising bonding a handle substrate to the device substrate.

6. The method of claim 5 wherein the bonding step comprises oxide bonding the handle substrate to the device substrate by forming an oxide layer between the device substrate and the handle substrate.

7. The method of claim 1 comprising the further step of depositing a layer of silicon nitride on the conformal layer of insulating material.

* * * * *